US012665581B2

(12) United States Patent
Chiou et al.

(10) Patent No.: US 12,665,581 B2
(45) Date of Patent: Jun. 23, 2026

(54) SEMICONDUCTOR DEVICES AND MULTI-BIT FLIP-FLOP CIRCUITS HAVING AN ASYMMETRICAL ROW STRUCTURE

(71) Applicant: MEDIATEK INC., Hsin-Chu (TW)

(72) Inventors: Yi-Horng Chiou, Hsinchu City (TW); Kin-Hooi Dia, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 483 days.

(21) Appl. No.: 17/989,654

(22) Filed: Nov. 17, 2022

(65) Prior Publication Data

US 2023/0179187 A1     Jun. 8, 2023

Related U.S. Application Data

(60) Provisional application No. 63/286,584, filed on Dec. 7, 2021.

(51) Int. Cl.
H03K 3/037 (2006.01)
H03K 3/012 (2006.01)
H10D 30/62 (2025.01)

(52) U.S. Cl.
CPC ........... H03K 3/0372 (2013.01); H03K 3/012 (2013.01); H10D 30/62 (2025.01)

(58) Field of Classification Search
CPC .... H03K 3/012; H03K 3/0372; H03K 3/3562; H03K 3/35625; H10D 30/62
See application file for complete search history.

(56) References Cited

U.S. PATENT DOCUMENTS

| | | | |
|---|---|---|---|
| 2019/0148407 A1 | 5/2019 | Guo | |
| 2020/0058681 A1* | 2/2020 | Lai | H10D 84/038 |
| 2020/0097634 A1* | 3/2020 | Chen | G06F 30/337 |
| 2020/0099368 A1* | 3/2020 | Wang | G06F 1/04 |
| 2021/0143800 A1 | 5/2021 | Lee | |
| 2021/0359667 A1* | 11/2021 | Dia | H03K 3/012 |
| 2021/0391850 A1* | 12/2021 | Wang | G01R 31/3187 |

FOREIGN PATENT DOCUMENTS

CN     113450844 A     9/2021

OTHER PUBLICATIONS

Yih-Lang Li et al., MCell: Multi-Row Cell Layout Synthesis with Resource Constrained MAX-SAT Based Detailed Routing, ICCAD '20, Nov. 2-5, 2020, Association for Computing Machinery, Virtual Event, USA, XP033897925.

* cited by examiner

*Primary Examiner* — Patrick O Neill
(74) *Attorney, Agent, or Firm* — Winston Hsu

(57) ABSTRACT

A semiconductor device includes a plurality of first functional blocks formed in a plurality of first cell rows, and a plurality of second functional blocks formed in a plurality of second cell rows. The first functional blocks are configured to provide a first predetermined function. The second functional blocks are configured to provide a second predetermined function which is the same as the first predetermined function. The first cell rows and the second cell rows have at least one different physical property. The plurality of first functional blocks and the plurality of second functional blocks are placed in a predetermined arrangement to sequentially generate a bit sequence, the predetermined arrangement having a sinuous shape or a serpentine shape.

18 Claims, 8 Drawing Sheets

SEMICONDUCTOR DEVICES AND MULTI-BIT FLIP-FLOP CIRCUITS HAVING AN ASYMMETRICAL ROW STRUCTURE

CROSS REFERENCE TO RELATED APPLICATIONS

This application claims the benefit of U.S. Provisional Application No. 63/286,584, filed on Dec. 7, 2021. The content of the application is incorporated herein by reference.

BACKGROUND

Due to the rapid growth of chip densities and increasing clock frequencies in modern high performance integrated circuit (IC) designs, power consumption has become an important issue. In synchronous IC chip designs, a large portion of the total power consumption is caused by the operation of flip-flops in a clock network. In conventional synchronous designs, all one-bit flip-flops were considered as independent components. However, in recent years, as the process technology has advanced, and the feature size of the IC has shrunk, it has become possible for minimum size clock drivers to trigger more than one flip-flop. As a result, multi-bit flip-flops have been created. Multiple one-bit flip-flops are configured to be triggered from a clock signal provided from a single clock driver. Sharing the clock driver among multiple one-bit flip-flops can reduce the total clock dynamic power consumption, and reduce the total area contributed by the multiple flip-flops and clock driver. Thus, the multiple flip-flops is more power, performance and area (PPA) efficient than conventional one-bit flip-flops.

Besides the PPA issue, the number of connections and robustness are also the issues to be considered when designing flip-flop circuits. Therefore, it would be desirable to have a novel multi-bit flip-flop architecture with not only efficient PPA but also reduced number of connections and improved robustness.

SUMMARY

According to an embodiment of the invention, a semiconductor device comprises a plurality of cell rows, a first functional block and a second functional block. The plurality of cell rows at least comprises a first cell row and a second cell row. The first functional block is formed in the first cell row and configured to provide a first predetermined function. The second functional block is formed in the second cell row and configured to provide a second predetermined function which is the same as the first predetermined function. The first cell row and the second cell row have at least one different physical property.

According to another embodiment of the invention, a multi-bit flip-flop circuit comprises a plurality of first cell rows, a plurality of second cell rows and a plurality of single-bit flip-flop circuits. The plurality of single-bit flip-flop circuits comprises a first single-bit flip-flop circuit formed in one of the first cell rows and a second single-bit flip-flop circuit formed in one of the second cell rows. The first cell rows and the second cell rows have at least one different physical property.

According to yet another embodiment of the invention, a multi-bit flip-flop circuit comprises a plurality of first cell rows, a plurality of second cell rows and a plurality of single-bit flip-flop circuits. A first portion of the plurality of single-bit flip-flop circuits are formed in the first cell rows and a second portion of the plurality of single-bit flip-flop circuits are formed in the second cell rows. The first cell rows and the second cell rows have at least one different physical property.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
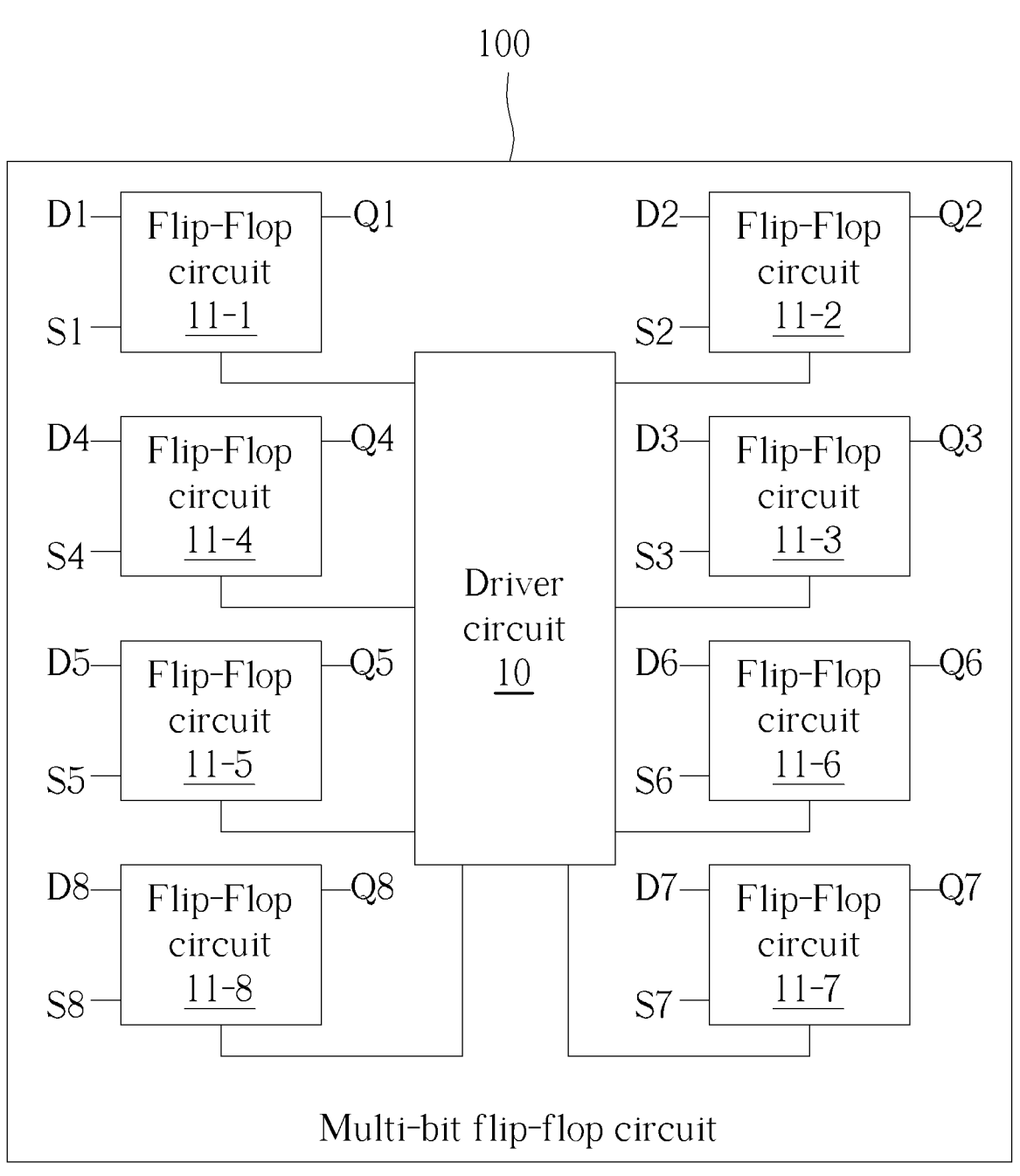
FIG. 1 is a block diagram of a multi-bit flip-flop circuit according to an embodiment of the invention.

FIG. 1 is a block diagram of a multi-bit flip-flop circuit according to an embodiment of the invention. The multi-bit flip-flop circuit 100 may be an 8-bit flip-flop, and may comprise a plurality of flip-flop circuits, such as eight flip-flop circuits 11-1, 11-2, 11-3, . . . , 11-8, and a driver circuit 10. The flip-flop circuits 11-1 to 11-8 may be single-bit flip-flop circuits, and the driver circuit 10 may be a shared circuit shared by the flip-flop circuits 11-1 to 11-8 and may be configured to provide at least one or more clock signals to trigger the eight flip-flop circuits 11-1 to 11-8. In some embodiments of the invention, the driver circuit 10 may comprise circuits or logics for clock generating, testing and/or flip-flop control, so as to provide clock signals and to test and/or control the flip-flop circuits 11-1 to 11-8.

Each flip-flop circuit receives a data input and a scan input, and accordingly generates an output, where the data input, the scan input and the output may all be one bit data. As an example, the flip-flop circuit 11-1 may be configured to receive a data input D1 and a scan input S1 and accordingly generate an output Q1, the flip-flop circuit 11-2 may be configured to receive a data input D2 and a scan input S2 and accordingly generate an output Q2, the flip-flop circuit 11-3 may be configured to receive a data input D3 and a scan input S3 and accordingly generate an output Q3, the flip-flop circuit 11-4 may be configured to receive a data input D4 and a scan input S4 and accordingly generate an output Q4, the flip-flop circuit 11-5 may be configured to receive a data input D5 and a scan input S5 and accordingly generate an output Q5, the flip-flop circuit 11-6 may be configured to receive a data input D6 and a scan input S6 and accordingly generate an output Q6, the flip-flop circuit 11-7 may be configured to receive a data input D7 and a scan input S7 and accordingly generate an output Q7, the flip-flop circuit 11-8 may be configured to receive a data input D8 and a scan input S8 and accordingly generate an output Q8.

According to an embodiment of the invention, a scan input terminal of one flip-flop circuit may be connected to an output terminal of another flip-flop circuit, to form a sequential cell structure.

As an example, the scan input terminal of the flip-flop circuit 11-2 may be connected to the output terminal of the flip-flop circuit 11-1, so that the output Q1 of the flip-flop circuit 11-1 may be provided to the flip-flop circuit 11-2 as the scan input thereof, the scan input terminal of the flip-flop circuit 11-3 may be connected to the output terminal of the flip-flop circuit 11-2, so that the output Q2 of the flip-flop circuit 11-2 may be provided to the flip-flop circuit 11-3 as the scan input thereof, the scan input terminal of the flip-flop circuit 11-4 may be connected to the output terminal of the flip-flop circuit 11-3, so that the output Q3 of the flip-flop circuit 11-3 may be provided to the flip-flop circuit 11-4 as the scan input thereof, the scan input terminal of the flip-flop circuit 11-5 may be connected to the output terminal of the flip-flop circuit 11-4, so that the output Q4 of the flip-flop circuit 11-4 may be provided to the flip-flop circuit 11-5 as the scan input thereof, the scan input terminal of the flip-flop circuit 11-6 may be connected to the output terminal of the flip-flop circuit 11-5, so that the output Q5 of the flip-flop circuit 11-5 may be provided to the flip-flop circuit 11-6 as the scan input thereof, the scan input terminal of the flip-flop circuit 11-7 may be connected to the output terminal of the flip-flop circuit 11-6, so that the output Q6 of the flip-flop circuit 11-6 may be provided to the flip-flop circuit 11-7 as the scan input thereof, and the scan input terminal of the flip-flop circuit 11-8 may be connected to the output terminal of the flip-flop circuit 11-7, so that the output Q7 of the flip-flop circuit 11-7 may be provided to the flip-flop circuit 11-8 as the scan input thereof.

It is to be noted that, in order to simplify the drawings, connections between the output terminal of one flip-flop circuit and the scan input terminal of a following flip-flop circuit are not shown in FIG. 1. In addition, it is to be noted that, in some embodiments of the invention, the order of numbering of the circuits having the same function, such as the plurality of flip-flop circuits 11-1 to 11-8 showing in FIG. 1, may also reflect the sequence or the order of the output or the bit generated by the plurality of flip-flop circuits. As an example, as the order of numbering of the plurality of flip-flop circuits is 11-1 to 11-8, the sequence or the order of the output or the bit (or, the output bit) generated by the plurality of flip-flop circuits is from Q1 to Q8, where the output Q1 is the earliest generated one, then the output Q2 is generated, then the output Q3 is generated, . . . and so on.

It is to be further noted that, a scan input terminal of one flip-flop circuit is not limited to be connected to an output terminal of another flip-flop circuit. According to another embodiment of the invention, a scan input terminal of one flip-flop circuit may be connected to an internal component or circuit of another flip-flop circuit instead of being connected to the output terminal of said another flip-flop circuit, as long as said internal component or circuit provides the same function as the output of said another flip-flop circuit or generates a signal having the same function as the output of said another flip-flop circuit. Therefore, for the connections between different flip-flop circuits, the invention is not limited to any specific way of implementation.

According to an embodiment of the invention, the proposed multi-bit flip-flop circuit, such as the multi-bit flip-flop circuit 100 shown in FIG. 1, may be a semiconductor device comprising a plurality of cell rows and a plurality of functional blocks, wherein the plurality of functional blocks, such as the flip-flop circuits 11-1 to 11-8, may have the same or substantially the same function, but the plurality of cell rows may not be identical cell rows. As an example, the plurality of cell rows of the semiconductor device may have an asymmetrical row structure, and plurality of functional blocks configured to have the same or substantially the same function may be respectively formed in one of the plurality of cell rows. In other words, in the embodiments of the invention, at least a first functional block and a second functional block configured to provide the same or substantially the same function in the semiconductor device, such as the single-bit flip-flop circuits or the flip-flop circuits shown in FIG. 1, are respectively formed in a first cell row and a second cell row having at least one different physical property.

Figure 2:
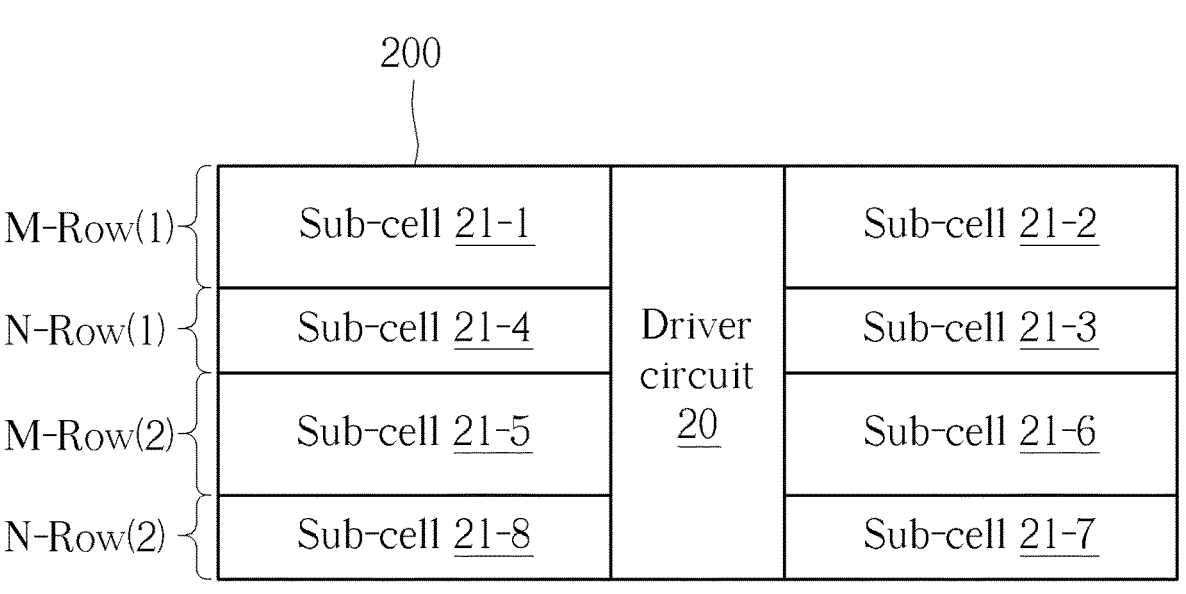
FIG. 2 is a schematic diagram showing the top view of an exemplary layout of a semiconductor device according to an embodiment of the invention.

FIG. 2 is a schematic diagram showing the top view of an exemplary layout of a semiconductor device according to an embodiment of the invention. According to an embodiment of the invention, the semiconductor device 200 may be a standard cell, such as a multi-bit flip-flop. The semiconductor device 200 may comprise a plurality of cell rows with an asymmetrical row structure. As shown in FIG. 2, the plurality of cell rows may be grouped into a first group of cell rows (labeled by the 'M-Row') and a second group of cell rows (labeled by the 'N-Row'). The M-Row(1) and the M-Row(2) in the first group of M-Rows may be identical cell rows with the same physical properties and the N-Row (1) and the N-Row(2) in the second group of N-Rows may be identical cell rows with the same physical properties, but the M-Rows and the N-Rows may not be identical, and may have at least one different physical property. Here, the term "asymmetrical row structure" is a description that differs from "symmetrical row structure". For a standard cell having "symmetrical row structure", the plurality of cell rows forming the standard cell are identical cell rows and are designed to have the same physical properties. On the contrary, for a standard cell having "asymmetrical row structure", the plurality of cell rows forming the standard cell are not all identical and may be designed to have at least one different physical property.

According to an embodiment of the invention, the aforementioned at least one different physical property may be selected from a group comprising a height (or, a number of tracks) or a driving capability. As an example, a height (e.g. the cell height) or a number of tracks of the cell rows in the first group of the M-Rows may be different from a height (e.g. the cell height) or a number of tracks of the cell rows in the second group of the N-Rows. As another example, a driving capability of the cell rows in the first group of the M-Rows may be different from a driving capability of the cell rows in the second group of the N-Rows. According to an embodiment of the invention, the driving capability of a cell row may be determined by at least one of a device width, a fin number and a finger number of a transistor device on the cell row.

Figure 3A:
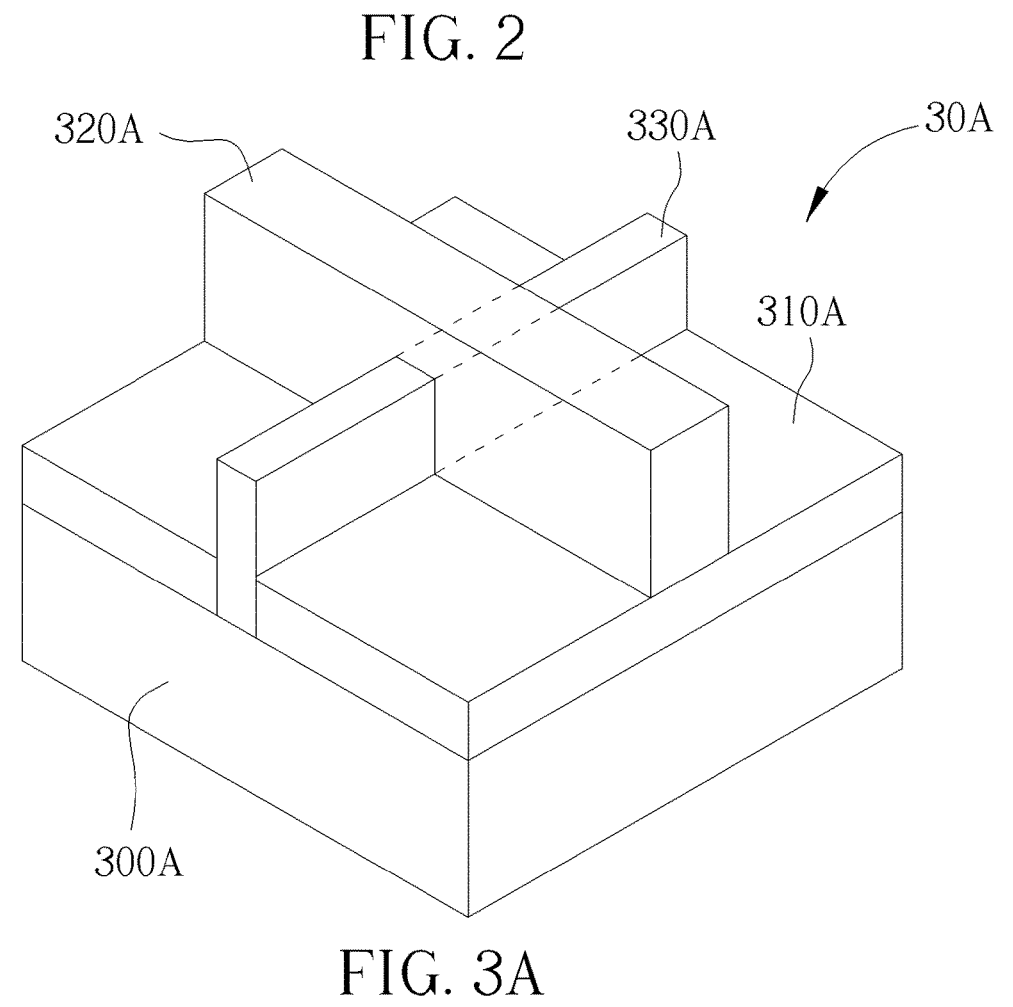
FIG. 3A is a cross section view of a FINFET with one fin and one finger.
Figure 3B:
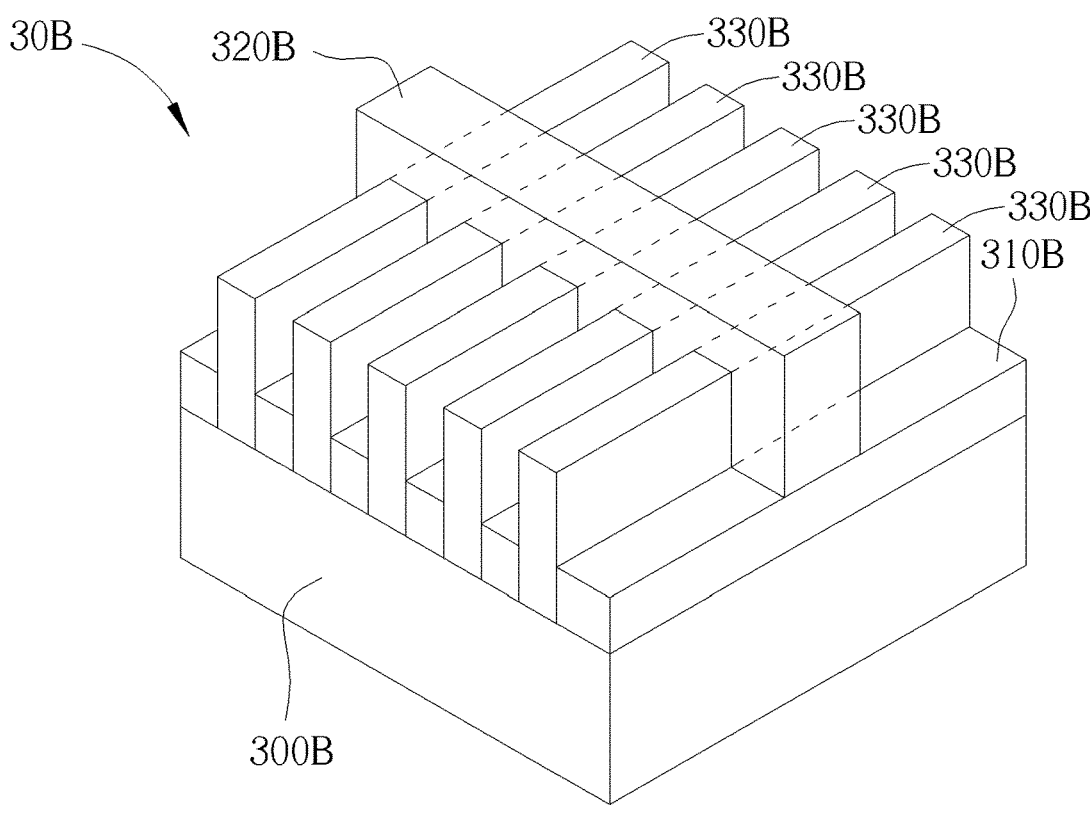
FIG. 3B shows a cross section view of another FINFET with one finger and five fins.

FIG. 3A shows a cross section view of a FINFET with one finger and one fin. The FINFET 30A comprises one finger 320A (e.g. the gate of the FINFET 30A) and one vertical fin 330A (e.g. the source and drain of the FINFET 30A) formed on the oxide layer 310A above the silicon substrate 300A. As a comparison, FIG. 3B shows a cross section view of another FINFET with one finger and five fins. The FINFET 30B comprises one finger 320B (e.g. the gate of the FINFET 30B) and five vertical fins 330B (e.g. the source and drain of the FINFET 30B) formed on the oxide layer 310B above the silicon substrate 300B. The five vertical fins 330B are aligned in parallel to increase driving strength (e.g. the driving capability).

According to an embodiment of the invention, the cell height may be related to the fin number of the transistor device on the cell row. As an example, the cell height may be related to two times of the fin number of the transistor device, and the cell height increases as the fin number increases. Therefore, as the cell height, the device width, the fin number or the finger number of a cell row increases, the driving capability of the cell row increases.

It is to be noted that, although FINFETs are illustrated above as examples, the invention should not be limited thereto. In other embodiments of the invention, the proposed semiconductor device or standard cell may also be composed of other types of Field Effect Transistor (FET) which are made by different or more advanced process.

Figure 3C:
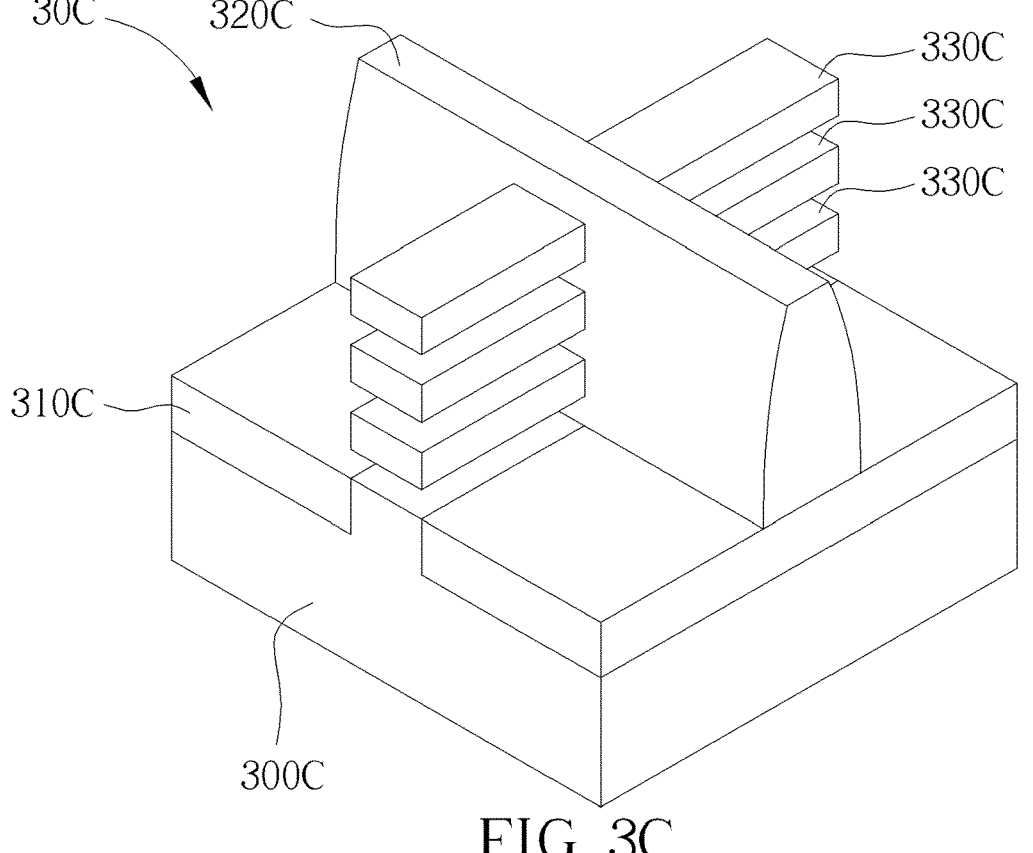
FIG. 3C shows a cross section view of a nanowire GAA FET with three nanowires.

FIG. 3C shows a cross section view of a nanowire Gate-All-Around (GAA) FET with three nanowires. The GAAFET 30C comprises one finger 320C (e.g. the gate of the GAAFET 30C) and three nanowires 330C (e.g. the source and drain of the GAAFET 30C) formed on the oxide layer 310C above the silicon substrate 300C. It is to be noted again that, none of the illustrated FINFET and the GAAFET forms a limit to the proposed semiconductor device or standard cell.

Referring back to FIG. 2, the semiconductor device 200, which may be a standard cell, may comprise a driver circuit 20 and a plurality of sub-cells, such as the sub-cells 21-1, 21-2, . . . , 21-8 shown in FIG. 2. The design of the driver circuit 20 may be similar to the driver circuit 10 shown in FIG. 1, therefore, the description of the driver circuit 20 may refer to the description in the paragraphs corresponding to FIG. 1, and is omitted here for brevity. Note that although those circuits are shown in the center of the layout, in the embodiments of the invention, the shared circuit, such as the shared driver circuits 10, 20, 40 and 80, are not limited to be located in center of the layout, and may be separated (e.g. by separating the driver circuit into several circuit sub-units) in other locations.

In an embodiment of the invention, the sub-cells 21-1, 21-2, . . . , 21-8 may be configured to have the same or substantially the same function. For example, when the semiconductor device 200 is a multi-bit flip-flop standard cell, each the sub-cells 21-1, 21-2, . . . , 21-8 may be a single-bit flip-flop circuit. In such embodiment, the sub-cells 21-1 and 21-2, 21-5 and 21-6 respectively formed in the M-Row(1) and M-Row(2) may be the single-bit flip-flops having a first cell height, the sub-cells 21-3 and 21-4, 21-7 and 21-8 respectively formed in the N-Row(1) and N-Row (2) may be the single-bit flip-flops having a second cell height, and the first cell height may be different from the second cell height as shown in FIG. 2. It is to be noted that, as descried above, the height or cell height is not the only choice of the different physical property in the embodiments of the invention. Any factor to cause the transistors on the M-Rows and the N-Rows to have different driving capabilities may be selected as the aforementioned physical property.

According to an embodiment of the invention, the M-Rows and the N-Rows may be arranged in an interleaved manner. As an example, the cell rows may be arranged in an interleaved manner with a pattern: M-N-M-N (where the letter 'M' represents the M-Row and the letter 'N' represents the N-Row, and the 'M' and 'N' are two rows having at least one different physical property as described above), such as the arrangement of M-Row(1), N-Row(1), M-Row(2) and N-Row(2) from a top to a bottom of the layout shown in FIG. 2. In some other embodiments of the invention, the cell rows may be arranged in an interleaved manner with a variant pattern such as M-M-N-N and M-N-N-M.

Figure 4:
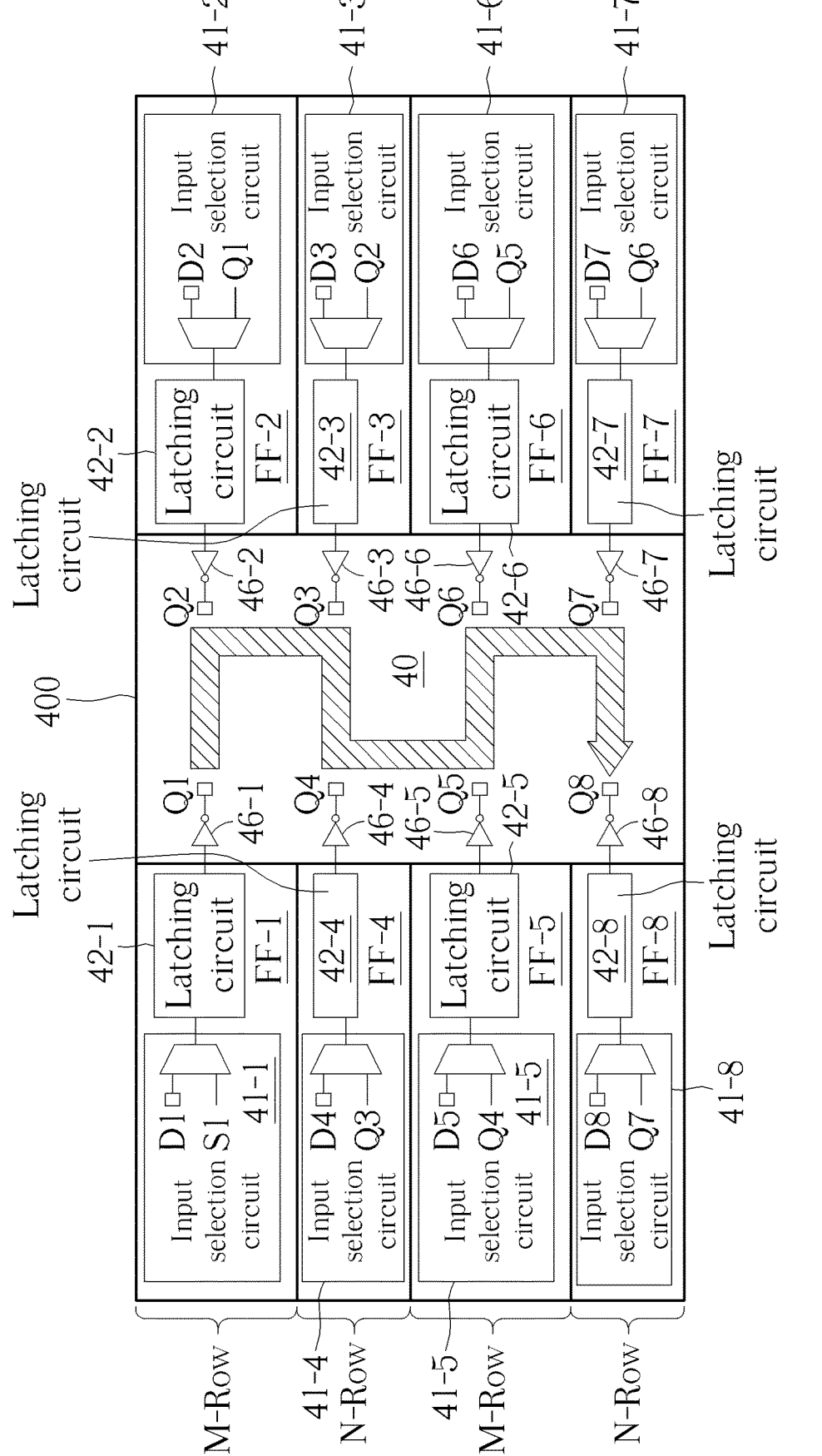
FIG. 4 is a schematic diagram showing the top view of an exemplary layout of a multi-bit flip-flop circuit according to an embodiment of the invention.

FIG. 4 is a schematic diagram showing the top view of an exemplary layout of a multi-bit flip-flop circuit according to an embodiment of the invention. In this embodiment, an exemplary layout of an 8-bit flip-flop circuit with an asymmetrical row structure is shown. However, it should be noted that the number of bits and the function of the circuit are not a limit of the invention. For example, the semiconductor device having an asymmetrical row structure may also be implemented as a multi-bit flip-flop other than an 8-bit flip-flop, or the semiconductor device having an asymmetrical row structure may also be implemented as a standard cell other than a multi-bit flip-flop.

In the embodiments of the invention, the multi-bit flip-flop circuit 400 may comprise multiple M-Rows and multiple N-Rows. In addition, the multi-bit flip-flop circuit 400 may comprise eight single-bit flip-flop circuits FF-1~FF-8 and a driver circuit 40 shared by the eight single-bit flip-flop circuits FF-1~FF-8.

The single-bit flip-flop circuit FF-1 may comprise an input selection circuit 41-1 and a latching circuit 42-1. The input selection circuit 41-1 is configured to provide a control signal (for example, a control bit) based on the data input D1 and the scan input S1. The latching circuit 42-1 is configured to generate the output Q1 based on the control bit received from the input selection circuit 41-1 in response to one or more clock signals provided by the driver circuit 40. The single-bit flip-flop circuit FF-2 may comprise an input selection circuit 41-2 and a latching circuit 42-2. The input selection circuit 41-2 is configured to provide a control signal (for example, a control bit) based on the data input D2 and the scan input S2, where the scan input S2 is the output Q1 provided by the single-bit flip-flop circuit FF-1. The latching circuit 42-2 is configured to generate the output Q2 based on the control bit received from the input selection circuit 41-2 in response to one or more clock signals provided by the driver circuit 40. Since the single-bit flip-flop circuit FF-1~FF-8 are configured to have the same function and are all comprise an input selection circuit and a latching circuit, the operations of the remaining single-bit flip-flop circuits FF-3~FF-8 are deduced by the analogy.

The driver circuit 40 may comprise output driver circuits, such as the output drivers 46-1~46-8, and above-mentioned one or more circuits or logics for clock generating, testing and/or flip-flop control, such as a scan enable driver (not shown) and/or a clock driver (not shown) for generating aforementioned one or more clock signals to control the operation of multi-bit flip-flop circuit 400.

As shows in FIG. 4, the multi-bit flip-flop circuit 400 may have an M-N-M-N row structure, where, from a top to a bottom of the layout, the single-bit flip-flop circuits FF-1 and FF-2 are formed in the first M-Row, the single-bit flip-flop circuits FF-4 and FF-3 are formed in the first N-Row, the single-bit flip-flop circuits FF-5 and FF-6 are formed in the second M-Row, and the single-bit flip-flop circuits FF-8 and FF-7 are formed in the second N-Row. As mentioned above, the first M-Row and the second M-Row may be identical cell rows and the first N-Row and the second N-Row may be identical cell rows, but the M-Rows and the N-Rows may not be identical, and may have at least one different physical property. The introductions of possible physical properties to discriminate the M-Rows and the N-Row may refer to the discussions provided above, and are omitted here for brevity.

Note that in the embodiments of the invention, the latching circuit and the corresponding output driver coupled thereto may be formed in the same row or in different rows, and the invention is not limited to either way of implementation. As an example, in some embodiments of the invention, the latching circuit 42-1 and the corresponding output driver 46-1 may be both formed in the first M-Row, but the invention is not limited to only such kind of implementation. In other embodiments of the invention, the latching circuit 42-1 may be formed in the first M-Row but the corresponding output driver 46-1 may be formed in another row different from the first M-Row. Similarly, in some embodiments of the invention, the latching circuit 42-4 and the corresponding output driver 46-4 may be both formed in the first N-Row, but the invention is not limited to only such kind of implementation. In other embodiments of the invention, the latching circuit 42-4 may be formed in the first N-Row but the corresponding output driver 46-4 may be formed in another row different from the first N-Row. The possible ways of arranging the other output drivers, such as the output driver 46-2, 46-3 and 46-5-46-8, are deduced by the analogy.

According to an embodiment of the invention, a bit sequence of a plurality of bits is sequentially generated by the plurality of single-bit flip-flop circuits FF-1~FF-8 placed in a predetermined arrangement, wherein the predetermined arrangement may have a sinuous shape or a serpentine shape. As mentioned above, in some embodiments of the invention, the order of numbering of the circuits having the same function, such as the single-bit flip-flop circuits FF-1~FF-8 showing in FIG. 4, may also reflect the sequence or the order of the output or the bit generated by the plurality of flip-flop circuits. As an example, the sequence or the order of the output or the bit (or, the output bit) generated by the plurality of single-bit flip-flop circuits FF-1~FF-8 is from Q1 to Q8, where the output Q1 is the earliest generated one, then the output Q2 is generated, then the output Q3 is generated, . . . and so on.

Figure 7:
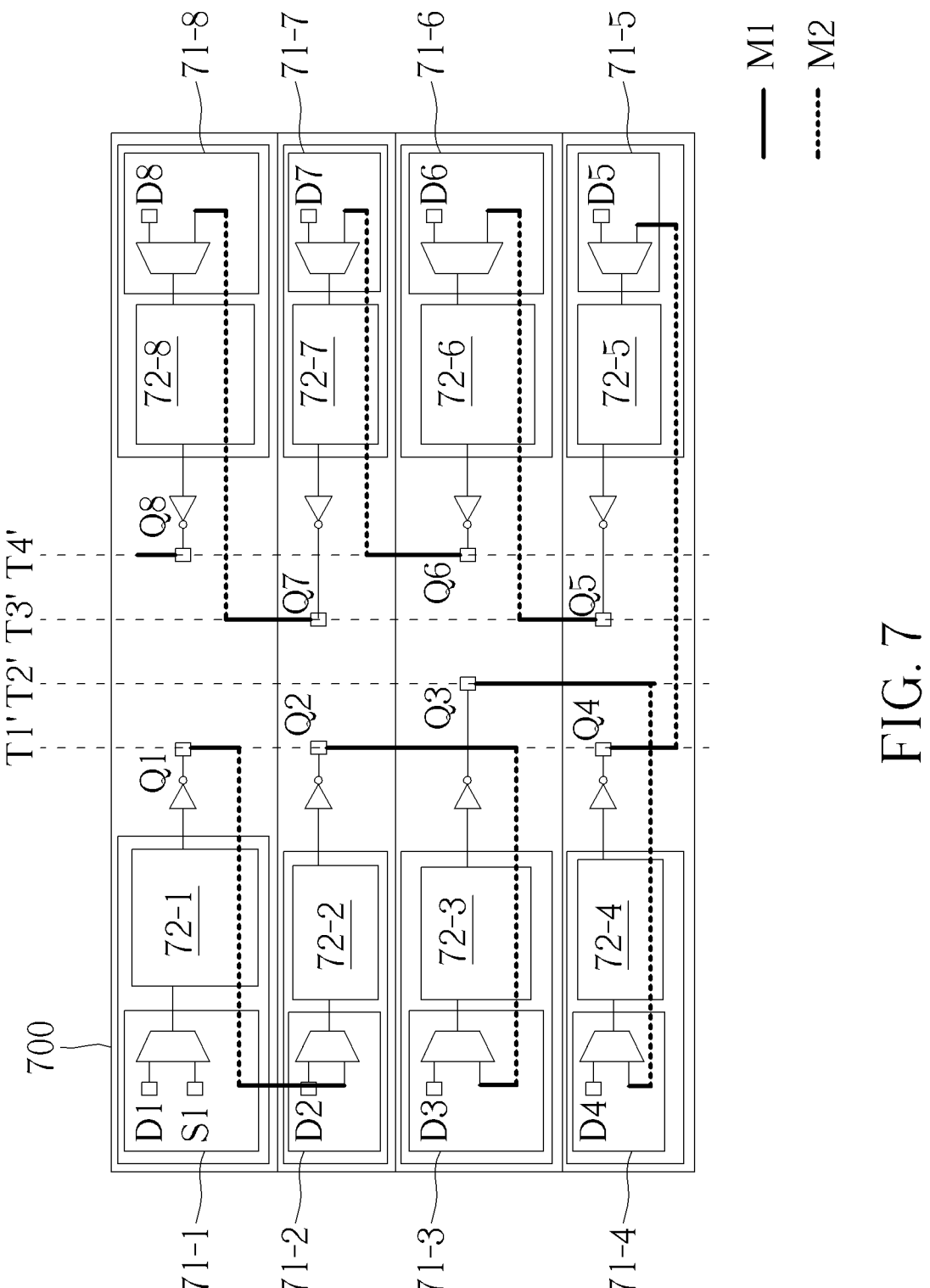
FIG. 7 is a schematic diagram showing the connections between single-bit flip-flop circuits of a multi-bit flip-flop circuit according to another embodiment of the invention.

As shown in FIG. 4, the plurality of single-bit flip-flop circuits FF-1~FF-8 are placed in a predetermined arrangement for a bit sequence of the plurality of bits to be sequentially generated by the single-bit flip-flop circuits FF-1~FF-8, wherein the predetermined arrangement may have a sinuous shape or a serpentine shape, such as the thick arrow filled with slashes shown in the middle of FIG. 4. In an embodiment of the invention, the predetermined arrangement may be the arrangement shown in FIG. 4, and may be an arrangement different from a U-shape arrangement, wherein in an exemplary U-shape arrangement, from the top to the bottom on the left half of the layout, the first to the fourth flip-flop circuits are placed, and from the bottom to the top on the right half of the layout, the fifth to the eighth flip-flop circuits are placed. An exemplary U-shape arrangement of the flip-flop circuits is shown in FIG. 7.

According to an embodiment of the invention, the aforementioned sinuous or serpentine shape may be a shape comprising at least two concatenated S patterns, such as the thick arrow shown in the FIG. 4. According to another embodiment of the invention, the aforementioned sinuous or serpentine shape may be a shape comprising more than one U turns or a shape comprising more than two turns or more than two turning points. According to yet another embodiment of the invention, the aforementioned sinuous or serpentine shape may be a shape different from an U shape.

Figure 5A:
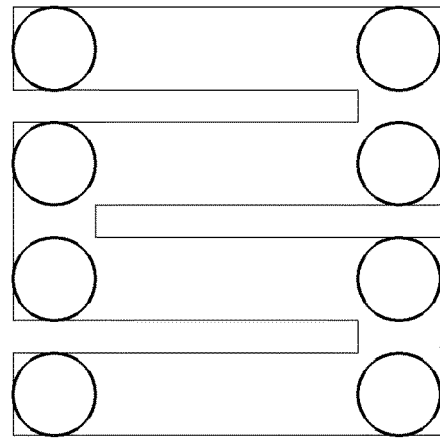
FIG. 5A shows an exemplary bit sequence generated by a plurality of single-bit flip-flop circuits placed in a predetermined arrangement, the predetermined arrangement having a sinuous or serpentine shape according to a first embodiment of the invention.
Figure 5B:
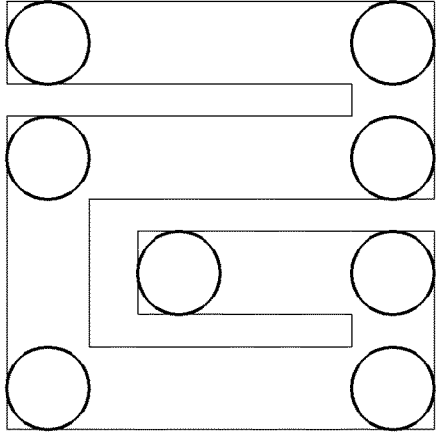
FIG. 5B shows another exemplary bit sequence generated by a plurality of single-bit flip-flop circuits placed in a predetermined arrangement, the predetermined arrangement having a sinuous or serpentine shape according to a second embodiment of the invention.
Figure 5C:
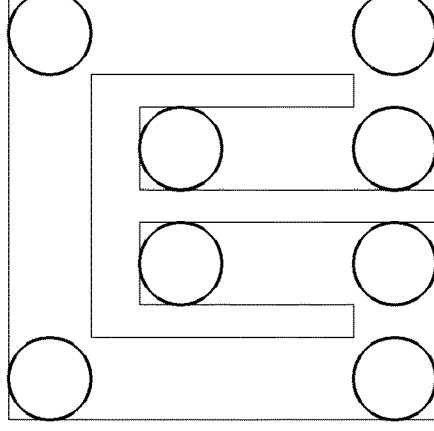
FIG. 5C shows yet another exemplary bit sequence generated by a plurality of single-bit flip-flop circuits placed in a predetermined arrangement, the predetermined arrangement having a sinuous or serpentine shape according to a third embodiment of the invention.

FIG. 5A shows an exemplary bit sequence generated by a plurality of single-bit flip-flop circuits placed in a predetermined arrangement, the predetermined arrangement having a sinuous or serpentine shape according to a first embodiment of the invention. FIG. 5B shows another exemplary bit sequence generated by a plurality of single-bit flip-flop circuits placed in a predetermined arrangement, the predetermined arrangement having a sinuous or serpentine shape according to a second embodiment of the invention. FIG. 5C shows yet another exemplary bit sequence generated by a plurality of single-bit flip-flop circuits placed in a predetermined arrangement, the predetermined arrangement having a sinuous or serpentine shape according to a third embodiment of the invention. In the embodiments shown in FIG. 5A, FIG. 5B and FIG. 5C, three exemplary sinuous or serpentine shape predetermined arrangements of the 8-bit flip-flop circuit for generating bit sequences are shown, and each terminal and each turning point of the exemplary shape may correspond to a single-bit flip-flop circuit generating one bit. Therefore, there are 8 circles respectively drawn in FIG. 5A, FIG. 5B and FIG. 5C and each circle corresponds to a location of the single-bit flip-flop circuit generating a bit (for example, the output bit) in the corresponding layout.

According to an embodiment of the invention, with the predetermined arrangement different from an U-shape arrangement, the issue of routing congestion may be solved.

Figure 6:
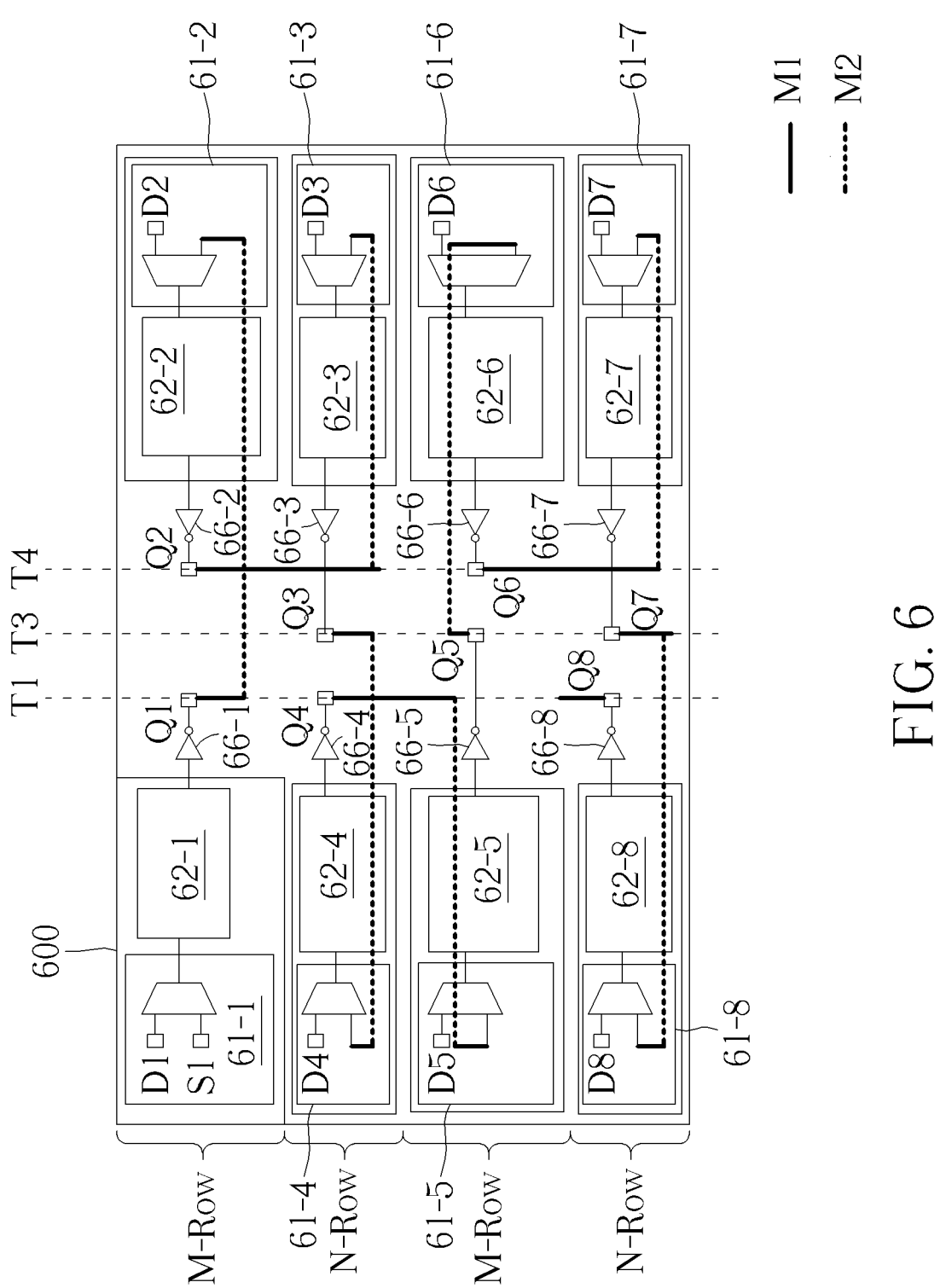
FIG. 6 is a schematic diagram showing the connections between single-bit flip-flop circuits of a multi-bit flip-flop circuit according to an embodiment of the invention.

FIG. 6 is a schematic diagram showing the connections between single-bit flip-flop circuits of a multi-bit flip-flop circuit according to an embodiment of the invention. In this embodiment, the multi-bit flip-flop circuit 600 is an 8-bit flip-flop circuit with an asymmetrical row structure and comprises eight single-bit flip-flop circuits, and each single-bit flip-flop circuit may comprise an input selection circuit (such as the input selection circuits 61-1~61-8 in FIG. 6) and a latching circuit (such as the latching circuits 62-1~62-8 in FIG. 6).

In FIG. 6, the connections in the metal layers, such as the connections in the metal layers M1 and M2, are respectively shown by different lines. In addition, the tracks in the vertical direction are also shown by the dotted lines drawn in the vertical direction. As shown in FIG. 6, the connections in the metal layer M1 only distribute on three vertical tracks (e.g. the T1, T3 and T4 shown in FIG. 6).

FIG. 7 is a schematic diagram showing the connections between single-bit flip-flop circuits of a multi-bit flip-flop circuit according to another embodiment of the invention. The multi-bit flip-flop circuit 700 is an 8-bit flip-flop circuit with an asymmetrical row structure and comprises eight single-bit flip-flop circuits, and each single-bit flip-flop circuit may comprise an input selection circuit (such as the input selection circuits 71-1~71-8 in FIG. 7) and a latching circuit (such as the latching circuits 72-1~72-8 in FIG. 7).

In FIG. 7, the connections in the metal layers, such as the connections in the metal layers M1 and M2, are also shown by different lines. In addition, the tracks in the vertical direction are also shown by dotted lines drawn in the vertical direction.

In this embodiment, an U-shape arrangement is shown, and the connections in the metal layer M1 distribute on four vertical tracks (e.g. the T1', T2', T3' and T4' shown in FIG. 7).

Comparing FIG. 6 and FIG. 7, the routing of U-shape arrangement in FIG. 7 is more congested than the routing of the predetermined arrangement in FIG. 6. In addition, with the predetermined arrangement, such as the arrangement shown in FIG. 4 or FIG. 6, the number of congested connections and the number of tracks having the metal connections distributed thereon are both reduced as compared to those of the U-shape arrangement, such as the arrangement shown in FIG. 7. Therefore, the sinuous or serpentine shape with the S-pattern like predetermined arrangement of single-bit flip-flops for generating the bit sequence mitigates the routing congestion by reducing routing tracks of wire connections. The fewer routing tracks being occupied by the wire connections required by a multi-bit flip-flop circuit, the more available tracks may be reserved and may be utilized by other circuits. Therefore, the bit floorplan with the single-bit flip-flop predetermined arrangement which mitigates the routing congestion, such as the arrangement shown in FIG. 4 or FIG. 6, is more PPA efficient than the U-shape arrangement shown in FIG. 7.

In addition, although the connections between single-bit flip-flop circuits shown in FIG. 6 are routed from the output drivers, such as the output drivers 66-1~66-8, of one flip-flop circuit to the input selection circuits of a following flip-flop circuit, the invention should not be limited thereto. As described above, the scan input terminal of one flip-flop circuit may also be connected to an internal component or circuit of a latching circuit in another (e.g. a previous) flip-flop circuit instead of being connected to the output terminal thereof.

To be more specific, in some embodiments of the invention, such as the schematic diagram shown in FIG. 6, the output terminal of the output drivers 66-1~66-7 are connected to the scan input terminal of a following flip-flop circuit to provide the corresponding outputs Q1~Q7 to the following flip-flop circuit. However, in other embodiments of the invention, the outputs Q1~Q7 (or, the scan input S2~S8) may also be directly provided by an internal component or circuit which generates a signal having the same function as the outputs Q1~Q7 (or, the scan input S2~S8) in the corresponding latching circuits 62-1~62-7 or through an internal net from the corresponding latching circuits 62-1~62-7 to the following flip-flop circuit. Therefore, the possible connections between the flip-flop circuits are not limited to the way shown in FIG. 6.

As an example, in an embodiment, the output Q1 of the first flip-flop circuit (or, a signal having the same function as the output Q1 or the corresponding scan input S2) may be directly provided by an internal circuit of the latching circuit 62-1 or provided through an internal net from the latching circuit 62-1 to the input selection circuit 61-2 of the second flip-flop circuit. Similarly, the output Q2 of the second flip-flop circuit (or, a signal having the same function as the output Q2 or the corresponding scan input S3) may be directly provided by an internal circuit of the latching circuit 62-2 or provided through an internal net from the latching circuit 62-2 to the input selection circuit 61-3 of the third flip-flop circuit, and the rest may be deduced by the analogy.

As another example, the output driver, such as the output driver 66-1, may also be implemented inside the corresponding latching circuit, such as the latching circuit 62-1. Similarly, the output driver 66-2 may also be implemented inside the corresponding latching circuit 62-2, and the rest may be deduced by the analogy.

According to an embodiment of the invention, the semiconductor device having a plurality of cell rows with an asymmetrical row structure may further have a hybrid circuit design. To be more specific, take the multi-bit flip-flop circuit (e.g. the multi-bit flip-flop circuit 100, 400 and 600) or the semiconductor device (e.g. the semiconductor device 200) comprising a plurality of single-bit flip-flop circuits and having a plurality of cell rows with an asymmetrical row structure as an example, at least one circuit sub-unit (for example but not limited to, the latching circuit) in a single-bit flip-flop circuit and at least one circuit sub-unit (for example but not limited to, the latching circuit) in another single-bit flip-flop circuit have the same function but have different circuitry, or, at least one circuit sub-unit in a single-bit flip-flop circuit and at least one circuit sub-unit in another single-bit flip-flop circuit have the different functions but the overall functionality (for example but not limited to, the latching functionality) provided by the circuit sub-units in the single-bit flip-flop circuit is the same as the overall functionality provided by the circuit sub-units in the other single-bit flip-flop circuit.

As another example, for the multi-bit flip-flop circuit (e.g. the multi-bit flip-flop circuit 100, 400 and 600) or the semiconductor device (e.g. the semiconductor device 200) comprising at least a first group of cell rows (such as, the M-Rows) and a second group of cell rows (such as, the N-Rows) and at least a first portion of a plurality of single-bit flip-flop circuits formed in the first group of cell rows and a second portion of the plurality of single-bit flip-flop circuits formed in the second group of cell rows, the first portion of the single-bit flip-flop circuits and the second portion of the single-bit flip-flop circuits have the same function but have different circuitry, or, at least one circuit sub-unit in any single-bit flip-flop circuit of the first portion of the single-bit flip-flop circuits and at least one circuit sub-unit in any single-bit flip-flop circuit of the second portion of the single-bit flip-flop circuits have the same function but have different circuitry.

Figure 8:
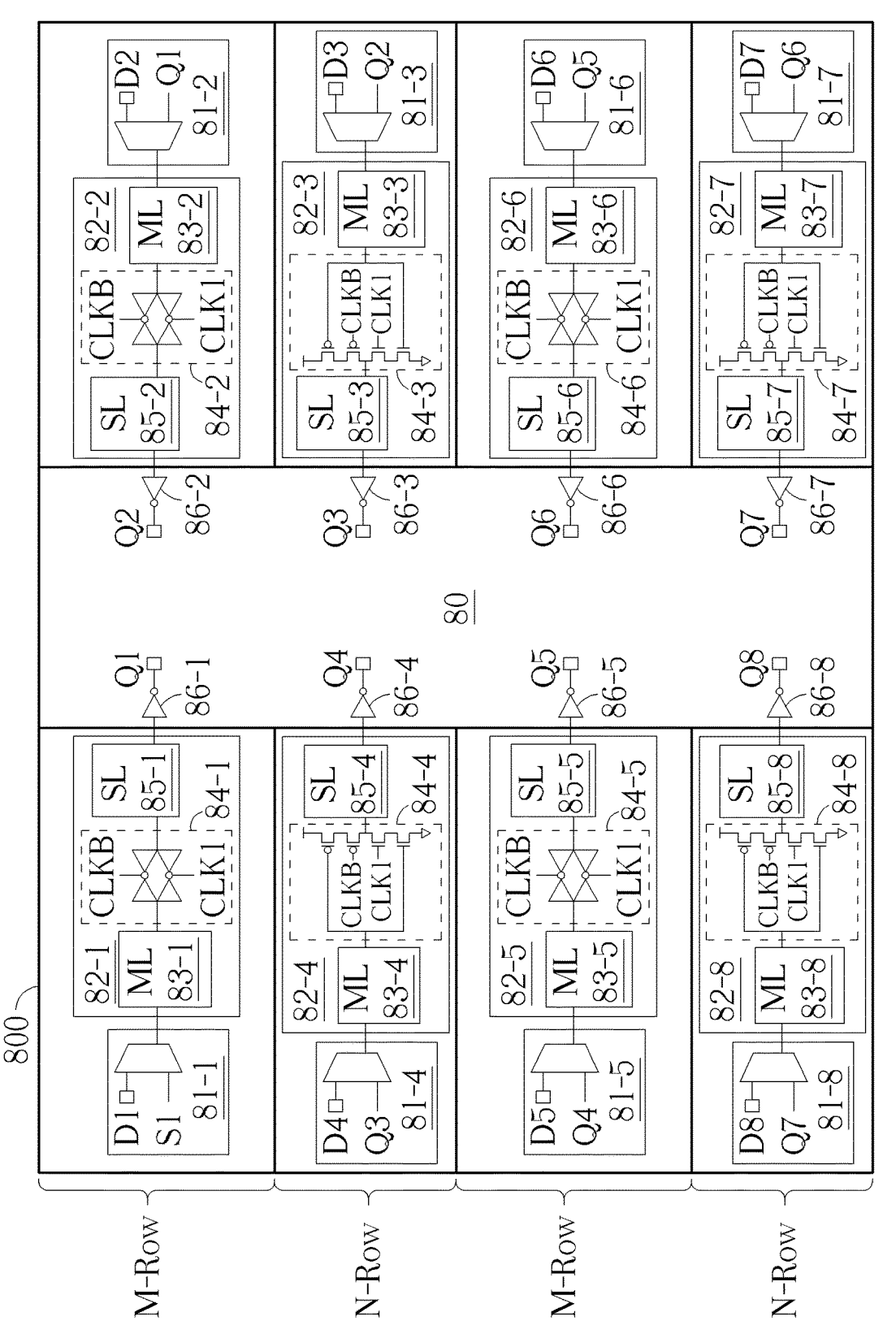
FIG. 8 shows an exemplary circuit diagram of a multi-bit flip-flop circuit according to an embodiment of the invention.

FIG. 8 shows an exemplary circuit diagram of a multi-bit flip-flop circuit according to an embodiment of the invention. In this embodiment, the multi-bit flip-flop circuit 800 is an 8-bit flip-flop circuit with an asymmetrical row structure and comprises eight single-bit flip-flop circuits and a driver circuit 80, each single-bit flip-flop circuit may comprise an input selection circuit (such as the input selection circuits 81-1~81-8 in FIG. 8) and a latching circuit (such as the latching circuits 82-1~82-8 in FIG. 8) and the driver circuit 80 may comprise a corresponding output driver (such as the output drivers 86-1~86-8 in FIG. 8) for each single-bit flip-flop circuit. The latching circuit may further comprise a plurality of circuit sub-units, which may comprise a master latch (ML) (such as the master latch 83-1~83-8 in FIG. 8), a slave latch (SL) (such as the slave latch 85-1~85-8 in FIG. 8) and a master-to-slave transfer circuit (such as the master-to-slave transfer circuit 84-1~84-8 in FIG. 8).

According to an embodiment, the latching circuit of the single-bit flip-flop circuit created in the M-Rows and the latching circuit of the single-bit flip-flop circuit created in the N-Rows may have the same function but have different circuitry. As an example, at least one of the master latch, the slave latch and the master-to-slave transfer circuit in the M-Rows has a circuit design or structure different from that in the N-Rows.

Take two different designs: design-A and design-B as an example, in some embodiments of the invention, the master latches 83-1, 83-2, 83-5 and 83-6 may have a ML circuitry of design-A and the master latches 83-3, 83-4, 83-7 and 83-8 may have a ML circuitry of design-B that is different from the ML circuitry of design-A, but both the ML circuitries of design-A and design-B provide the same function or operate in the same or a similar way.

Likewise, in some embodiments of the invention, the slave latches 85-1, 85-2, 85-5 and 85-6 may have a SL circuitry of design-A and the master latches 85-3, 85-4, 85-7 and 85-8 may have a SL circuitry of design-B that is different from the SL circuitry of design-A, but both the SL circuitries of design-A and design-B provide the same function or operate in the same or a similar way.

Also, in yet some embodiments of the invention, the master-to-slave transfer circuits 84-1, 84-2, 84-5 and 84-6 may have a transfer circuitry of design-A and the master-to-slave transfer circuits 84-3, 84-4, 84-7 and 84-8 may have a transfer circuitry of design-B that is different from the transfer circuitry of design-A, but both the transfer circuitries of design-A and design-B provide the same function or operate in the same or a similar way. As an example, the master-to-slave transfer circuits 84-1, 84-2, 84-5 and 84-6 of design-A may respectively comprise a transmission gate coupled between the ML circuitry and the SL circuitry and configured to receive the clock signals CLK1 and CLKB, while the master-to-slave transfer circuits 84-3, 84-4, 84-7 and 84-8 of design-B may respectively comprise multiple serially coupled transistors coupled between the ML circuitry and the SL circuitry and configured to receive the clock signals CLK1 and CLKB.

In the embodiments of the invention, the configuration of design-A and design-B may be determined based on the robustness requirement. In an embodiment of the invention, the design-A and design-B for the circuitries in the M-Rows and N-Rows may be flexibly selected for the eight single-bit flip-flop circuits to have equal or substantially equal performance or robustness, such as the robustness to low VDD power, the robustness to the extreme temperature, or the like.

According to another embodiment, the latching circuits of the single-bit flip-flop circuits, such as the master latch 83-1~83-8 in FIG. 8, may also have different functions. As an example, the master latches 83-1 and 83-2, although they are both labeled by 'ML' in FIG. 8 may actually have different functions. Similarly, the master latches 83-1 and 83-3~83-8, although they are all labeled by 'ML' in FIG. 8 may all have different functions. In addition, the slave latches 85-1 and 85-2, although they are both labeled by 'SL' in FIG. 8 may actually have different functions. Similarly, the slave latches 85-1 and 85-3~85-8, although they are all labeled by 'SL' in FIG. 8 may all have different functions. Similar concept may be applied to the master-to-slave transfer circuits 84-1~84-8. Therefore, although master latches and slave latches are provided here as an implementation of a single-bit flip-flop circuit, the invention should not be limited thereto.

In the embodiment of the invention, the master latches 83-1~83-8 may respectively have different functions, the slave latches 85-1~85-8 may respectively have different functions and/or the master-to-slave transfer circuits 84-1~84-8 may respectively have different functions, but the overall functionality (for example but not limited to, the latching functionality) that is naturally generated by each single-bit flip-flop circuit when the aforementioned circuits and circuit sub-units cooperate will be the same.

As an example, in an embodiment of the invention, the master latches 83-1 and 83-2 may have different functions, the slave latches 85-1 and 85-2 may have different functions, and/or the master-to-slave transfer circuits 84-1 and 84-2 may have different functions, but the overall functionality that is naturally generated by the circuits in the first single-bit flip-flop circuit (e.g. including the input selection circuit 81-1, the master latch 83-1, the master-to-slave transfer circuit 84-1, the slave latch 85-1 and the output driver 86-1) is still the same as the overall functionality that is naturally generated by the circuits in the second single-bit flip-flop circuit (e.g. including the input selection circuit 81-2, the master latch 83-2, the master-to-slave transfer circuit 84-2, the slave latch 85-2 and the output driver 86-2). Therefore, although the circuits in the first single-bit flip-flop and the second single-bit flip-flop have different functions, after the cooperation of these circuits, the first single-bit flip-flop and the second single-bit flip-flop are still able to provide the same flip-flop functionality.

Similarly, in an embodiment of the invention, the master latches 83-1 and 83-4 may have different functions, the slave latches 85-1 and 85-4 may have different functions, and/or the master-to-slave transfer circuits 84-1 and 84-4 may have different functions, but the overall functionality that is naturally generated by the circuits of the first single-bit flip-flop circuit (e.g. including the input selection circuit 81-1, the master latch 83-1, the master-to-slave transfer circuit 84-1, the slave latch 85-1 and the output driver 86-1) is still the same as the overall functionality that is naturally generated by the circuits of the fourth single-bit flip-flop circuit (e.g. including the input selection circuit 81-4, the master latch 83-4, the master-to-slave transfer circuit 84-4, the slave latch 85-4 and the output driver 86-4). Therefore, although the circuits in the first single-bit flip-flop and the fourth single-bit flip-flop have different functions, after the cooperation of these circuits, the first single-bit flip-flop and the fourth single-bit flip-flop are still able to provide the same flip-flop functionality. Description for the remaining single-bit flip-flop circuits are deduced by the analogy.

To summarize, in the embodiments of the invention, several semiconductor devices and multi-bit flip-flop circuits having an asymmetrical row structure are provided. The provided semiconductor devices and multi-bit flip-flop circuits have PPA efficient multi-bit flip-flop topologies which occupy small area and have fewer routing congestions as compared to the conventional design. In this manner, a compact and asymmetrical performance multi-bit flip-flop is created. Note that in the embodiments of the invention, when applying one or more of the inventive concepts such as the asymmetrical row structure, the arrangement of the flip-flop circuits, the bit floorplan and the hybrid circuit design, the semiconductor device having an asymmetrical row structure may also be implemented as a multi-bit flip-flop other than an 8-bit flip-flop, or the semiconductor device having an asymmetrical row structure may also be implemented as a standard cell other than a multi-bit flip-flop. Therefore, the proposed semiconductor device having an asymmetrical row structure should not be limited to only the 8-bit flip-flop circuits or the multi-bit flip-flop standard cells as illustrated in the embodiments of the invention.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor device, comprising:
a plurality of cell rows, wherein the plurality of cell rows comprise a plurality of first cell rows and a plurality of second cell rows;
a plurality of first functional blocks, respectively formed in the plurality of first cell rows and configured to provide a first predetermined function; and
a plurality of second functional blocks, respectively formed in the plurality of second cell rows and configured to provide a second predetermined function which is the same as the first predetermined function, wherein the plurality of first cell rows and the plurality of second cell rows have at least one different physical property, and the plurality of first functional blocks and the plurality of second functional blocks are placed in a predetermined arrangement to sequentially generate a bit sequence having a plurality of bits respectively generated by the plurality of first functional blocks and the plurality of second functional blocks, the predetermined arrangement having a sinuous shape or a serpentine shape, wherein an output of a first functional block of the plurality of first functional blocks in a first cell row is input to another first functional block of the plurality of first functional blocks in a same first cell row or input to a second functional block of the plurality of second functional blocks in a second cell row directly adjacent to the first cell row, and an output of a second functional block of the plurality of second functional blocks in a second cell row is input to another second functional block of the plurality of second functional blocks in a same second cell row or input to a first functional block of the plurality of first functional blocks in a first cell row directly adjacent to the second cell row.

2. The semiconductor device of claim 1, wherein each first functional block and each second functional block is a single-bit flip-flop circuit.

3. The semiconductor device of claim 1, wherein a height of the first cell rows is different from a height of the second cell rows.

4. The semiconductor device of claim 1, wherein a driving capability of the first cell rows is different from a driving capability of the second cell rows, and wherein the driving capability of the first/second cell rows is determined by at least one of a device width, a fin number and a finger number of a transistor device on the first/second cell row.

5. The semiconductor device of claim 1, wherein the plurality of first cell rows and the plurality of second cell rows are arranged in an interleaved manner.

6. A multi-bit flip-flop circuit, comprising:
a plurality of first cell rows;
a plurality of second cell rows; and
a plurality of single-bit flip-flop circuits, comprising:
    a first single-bit flip-flop circuit, formed in one of the first cell rows;
    a second single-bit flip-flop circuit, formed in one of the second cell rows;
    a third single-bit flip-flop circuit, formed in said one of the first cell rows; and
    a fourth single-bit flip-flop circuit, formed in said one of the second cell rows;
wherein the plurality of first cell rows and the plurality of second cell rows have at least one different physical property, and the plurality of single-bit flip-flop circuits are placed in a predetermined arrangement to sequentially generate a bit sequence having a plurality of bits respectively generated by the plurality of single-bit flip-flop circuits, the predetermined arrangement having a sinuous shape or a serpentine shape, wherein an output of a single-bit flip-flop circuit of the plurality of single-bit flip-flop circuits in a first cell row is input to another single-bit flip-flop circuit of the plurality of single-bit flip-flop circuits in a same first cell row or input to a single-bit flip-flop circuit of the plurality of single-bit flip-flop circuits in a second cell row directly adjacent to the first cell row, and an output of a single-bit flip-flop circuit of the plurality of single-bit flip-flop circuits in a second cell row is input to another single-bit flip-flop circuit of the plurality of single-bit flip-flop circuits in a same second cell row or input to a single-bit flip-flop circuit of the plurality of single-bit flip-flop circuits in a first cell row directly adjacent to the second cell row.

7. The multi-bit flip-flop circuit of claim 6, wherein a height of one of the first cell rows is different from a height of one of the second cell rows.

8. The multi-bit flip-flop circuit of claim 6, wherein a driving capability of one of the first cell rows is different from a driving capability of one of the second cell rows, and wherein the driving capability of said one of the first/second cell rows is determined by at least one of a device width, a fin number and a finger number of a transistor device on said one of the first/second cell rows.

9. The multi-bit flip-flop circuit of claim 6, wherein the plurality of single-bit flip-flop circuits further comprises:
a fifth single-bit flip-flop circuit, formed in another of the first cell rows;
a sixth single-bit flip-flop circuit, formed in another of the second cell rows;
a seventh single-bit flip-flop circuit, formed in said another of the first cell rows; and
an eighth single-bit flip-flop circuit, formed in said another of the second cell rows.

10. The multi-bit flip-flop circuit of claim 6, wherein at least one circuit sub-unit in the first single-bit flip-flop circuit and at least one circuit sub-unit in the second single-bit flip-flop circuit have the same function but have different circuitry.

11. The multi-bit flip-flop circuit of claim 6, wherein the plurality of first cell rows and the plurality of second cell rows are arranged in an interleaved manner.

12. A multi-bit flip-flop circuit, comprising:
a plurality of first cell rows;
a plurality of second cell rows; and
a plurality of single-bit flip-flop circuits, wherein a first portion of the plurality of single-bit flip-flop circuits are formed in the first cell rows and a second portion of the plurality of single-bit flip-flop circuits are formed in the second cell rows;
wherein the first cell rows and the second cell rows have at least one different physical property, and the plurality of single-bit flip-flop circuits are placed in a predetermined arrangement to sequentially generate a bit sequence having a plurality of bits respectively generated by the plurality of single-bit flip-flop circuits, the predetermined arrangement having a sinuous shape or a serpentine shape, wherein an output of a single-bit flip-flop circuit of the plurality of single-bit flip-flop circuits in a first cell row is input to another single-bit flip-flop circuit of the plurality of single-bit flip-flop circuits in a same first cell row or input to a single-bit flip-flop circuit of the plurality of single-bit flip-flop circuits in a second cell row directly adjacent to the first cell row, and an output of a single-bit flip-flop circuit of the plurality of single-bit flip-flop circuits in a second cell row is input to another single-bit flip-flop circuit of the plurality of single-bit flip-flop circuits in a same second cell row or input to a single-bit flip-flop circuit of the plurality of single-bit flip-flop circuits in a first cell row directly adjacent to the second cell row.

13. The multi-bit flip-flop circuit of claim 12, wherein the plurality of first cell rows at least comprise a first first cell row and a second first cell row, the plurality of second cell rows at least comprise a first second cell row and a second second cell row, and an arrangement of the plurality of first cell rows and the plurality of second cell rows from a top to a bottom of a layout is the first first cell row, the first second cell row, the second first cell row and the second second cell row.

14. The multi-bit flip-flop circuit of claim 13, wherein the plurality of single-bit flip-flop circuits comprises:

a first single-bit flip-flop circuit, formed in the first first cell row;

a second single-bit flip-flop circuit, formed in the first first cell row, a third single-bit flip-flop circuit, formed in the first second cell row;

a fourth single-bit flip-flop circuit, formed in the first second cell row;

a fifth single-bit flip-flop circuit, formed in the second first cell row;

a sixth single-bit flip-flop circuit, formed in the second first cell row;

a seventh single-bit flip-flop circuit, formed in the second second cell row; and an eight single-bit flip-flop circuit, formed in the second second cell row.

15. The multi-bit flip-flop circuit of claim 12, wherein the plurality of first cell rows at least comprise a first first cell row and a second first cell row, the plurality of second cell rows at least comprise a first second cell row and a second second cell row, and an arrangement of the plurality of first cell rows and the plurality of second cell rows from a top to a bottom of a layout is the first first cell row, the first second cell row, the second second cell row and the second first cell row.

16. The multi-bit flip-flop circuit of claim 12, wherein the plurality of first cell rows at least comprise a first first cell row and a second first cell row, the plurality of second cell rows at least comprise a first second cell row and a second second cell row, and an arrangement of the plurality of first cell rows and the plurality of second cell rows from a top to a bottom of a layout is the first first cell row, the second first cell row, the first second cell row and the second second cell row.

17. The multi-bit flip-flop circuit of claim 12, wherein the first portion of the plurality of single-bit flip-flop circuits and the second portion of the plurality of single-bit flip-flop circuits have the same function but have different circuitry.

18. The multi-bit flip-flop circuit of claim 12, wherein at least one circuit sub-unit in any single-bit flip-flop circuit of the first portion of the plurality of single-bit flip-flop circuits and at least one circuit sub-unit in any single-bit flip-flop circuit of the second portion of the plurality of single-bit flip-flop circuits have the same function but have different circuitry.

\* \* \* \* \*